United States Patent
Benaissa

(10) Patent No.: US 9,508,708 B2
(45) Date of Patent: Nov. 29, 2016

(54) POLY RESISTOR FOR METAL GATE INTEGRATED CIRCUITS

(71) Applicant: Texas Instruments Incorporated, Dallas, TX (US)

(72) Inventor: Kamel Benaissa, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/569,932

(22) Filed: Dec. 15, 2014

(65) Prior Publication Data

US 2015/0171077 A1    Jun. 18, 2015

Related U.S. Application Data

(62) Division of application No. 14/074,831, filed on Nov. 8, 2013, now Pat. No. 8,940,612.

(60) Provisional application No. 61/747,043, filed on Dec. 28, 2012.

(51) Int. Cl.

| | |
|---|---|
| H01L 27/06 | (2006.01) |
| H01L 27/11 | (2006.01) |
| H01L 27/02 | (2006.01) |
| H01L 49/02 | (2006.01) |
| H01L 29/43 | (2006.01) |
| H01L 29/49 | (2006.01) |
| H01L 29/51 | (2006.01) |
| H01L 29/66 | (2006.01) |
| H01L 29/78 | (2006.01) |

(52) U.S. Cl.
CPC ....... *H01L 27/0629* (2013.01); *H01L 27/0288* (2013.01); *H01L 27/1112* (2013.01); *H01L 28/20* (2013.01); *H01L 29/435* (2013.01); *H01L 29/6659* (2013.01); *H01L 29/66545* (2013.01); *H01L 29/4966* (2013.01); *H01L 29/517* (2013.01); *H01L 29/665* (2013.01); *H01L 29/7843* (2013.01)

(58) Field of Classification Search
CPC ... H01L 28/20; H01L 28/26; H01L 27/0629; H01L 27/105; H01L 27/1112; H01L 27/0288
See application file for complete search history.

(56) References Cited

U.S. PATENT DOCUMENTS

| | | | |
|---|---|---|---|
| 4,225,877 A * | 9/1980 | Miles et al. | 257/370 |
| 6,369,409 B1 * | 4/2002 | Takasu et al. | 257/60 |
| 2009/0051008 A1 * | 2/2009 | Shin et al. | 257/536 |
| 2010/0327370 A1 | 12/2010 | Jan et al. | |
| 2013/0043542 A1 * | 2/2013 | Igarashi | H01L 27/0629 257/380 |

* cited by examiner

*Primary Examiner* — Eduardo A Rodela
(74) *Attorney, Agent, or Firm* — Jacqueline J. Garner; Frank D. Cimino

(57) ABSTRACT

An integrated circuit containing a metal gate transistor and a thin polysilicon resistor may be formed by forming a first layer of polysilicon and removed it in an area for the thin polysilicon resistor. A second layer of polysilicon is formed over the first layer of polysilicon and in the area for the thin polysilicon resistor. The thin polysilicon resistor is formed in the second layer of polysilicon and the sacrificial gate is formed in the first layer of polysilicon and the second layer of polysilicon. A PMD layer is formed over the second layer of polysilicon and a top portion of the PMD layer is removed so as to expose the sacrificial gate but not expose the second layer of polysilicon in the thin polysilicon resistor. The sacrificial gate is removed and a metal replacement gate is formed.

7 Claims, 19 Drawing Sheets

POLY RESISTOR FOR METAL GATE INTEGRATED CIRCUITS

CROSS-REFERENCE TO RELATED APPLICATIONS

This application is a divisional of U.S. Non Provisional application Ser. No. 14/074,831, filed Nov. 8, 2013, and claims the benefit of priority under U.S.C. §119(e) of U.S. Provisional application Ser. No. 61/747,043 filed Dec. 28, 2012, the contents of which are herein incorporated by reference in its entirety.

FIELD OF THE INVENTION

This invention relates to the field of integrated circuits. More particularly, this invention relates to polysilicon resistors in integrated circuits with metal gates

BACKGROUND OF THE INVENTION

Polysilicon resistors are an important component in integrated circuits. It may be desirable to control a doping density in the polysilicon resistor. In replacement gate metal integrated circuits typically transistors with polysilicon gates are first formed and covered with a layer of dielectric. The dielectric layer is then thinned until the tops of the polysilicon gates are exposed. The polysilicon gates are then removed and replaced with metal gates.

Typically when polysilicon resistors are required in these integrated circuits, a thin layer of blocking dielectric is deposited after the dielectric layer is thinned and then patterned and etched to leave dielectric over the polysilicon resistors. The blocking dielectric layer prevents the polysilicon in the resistors from being removed when the polysilicon gates are removed. One disadvantage with forming polysilicon resistors by this method is that the polysilicon resistor height is determined by the thinning process, which may vary from resistor to resistor, across a wafer and between wafers and between fabrication lots. Variation in the height of the polysilicon undesirably results in variation in resistance of the polysilicon resistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a metal gate transistor and a thin polysilicon resistor may be formed by forming a first layer of polysilicon over a substrate. The first layer of polysilicon is subsequently removed in an area for the thin polysilicon resistor and is left in an area for a sacrificial gate of the metal gate transistor. A second layer of polysilicon is formed over the first layer of polysilicon and in the area for the thin polysilicon resistor. The thin polysilicon resistor is formed in the second layer of polysilicon and the sacrificial gate is formed in the first layer of polysilicon and the second layer of polysilicon. A pre-metal dielectric (PMD) layer is formed over the second layer of polysilicon and a top portion of the PMD layer is removed so as to expose the sacrificial gate but not expose the second layer of polysilicon in the thin polysilicon resistor. The sacrificial gate is removed and a metal replacement gate is formed. The second layer of polysilicon provides a thin resistor body for the thin polysilicon resistor.

Formation of an alternative exemplary integrated circuit is illustrated in FIG. 2A through FIG. 2E.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing a metal gate transistor and a thin polysilicon resistor may be formed by forming a first layer of polysilicon over a substrate. The first layer of polysilicon is subsequently removed in an area for the thin polysilicon resistor and is left in an area for a sacrificial gate of the metal gate transistor. A second layer of polysilicon is formed over the first layer of polysilicon and in the area for the thin polysilicon resistor. The thin polysilicon resistor is formed in the second layer of polysilicon and the sacrificial gate is formed in the first layer of polysilicon and the second layer of polysilicon. A PMD layer is formed over the second layer of polysilicon and a top portion of the PMD layer is removed so as to expose the sacrificial gate but not expose the second layer of polysilicon in the thin polysilicon resistor. The sacrificial gate is removed and a metal replacement gate is formed. The second layer of polysilicon provides a thin resistor body for the thin polysilicon resistor.

Figure 1A:
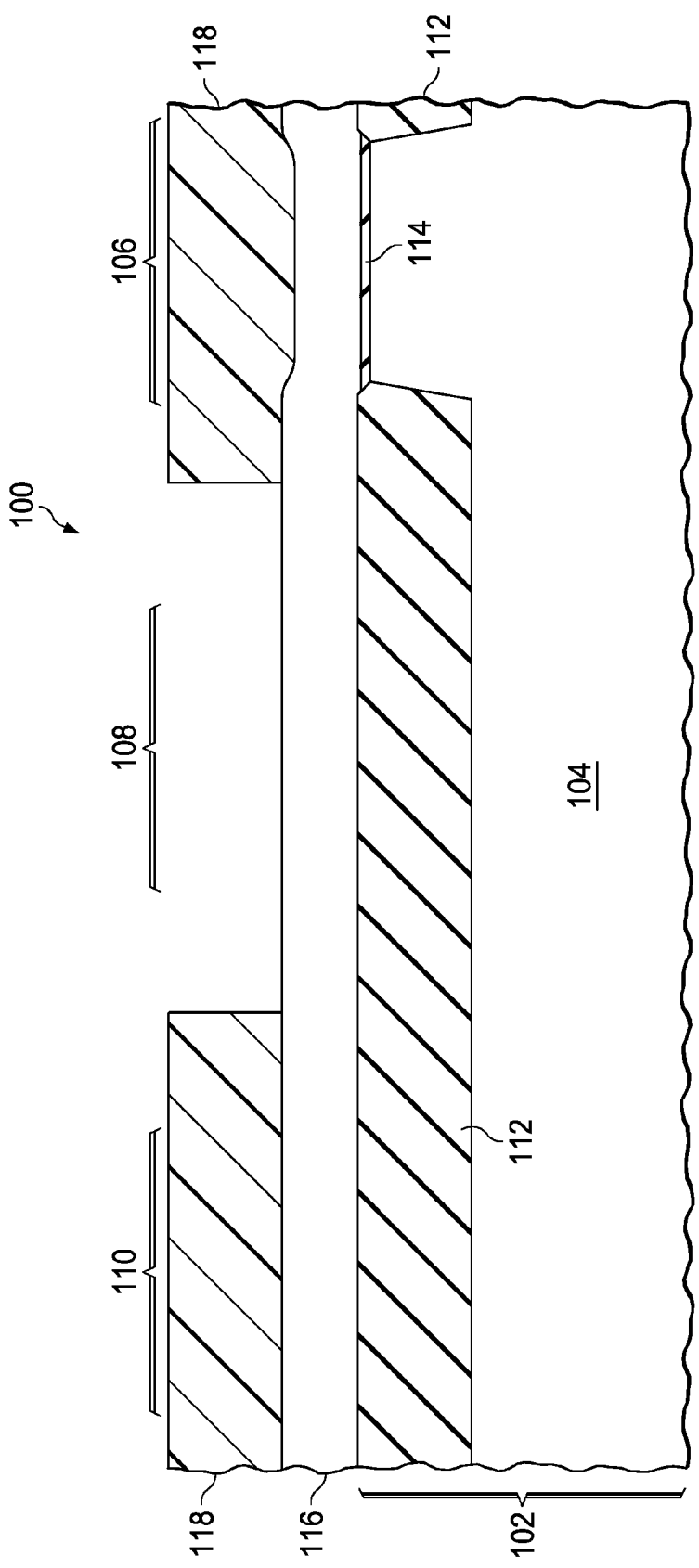
FIG. 1A through FIG. 1N are cross sections of an exemplary integrated circuit containing a thin polysilicon resistor and a metal gate transistor, depicted in successive stages of fabrication.
Figure 1B:
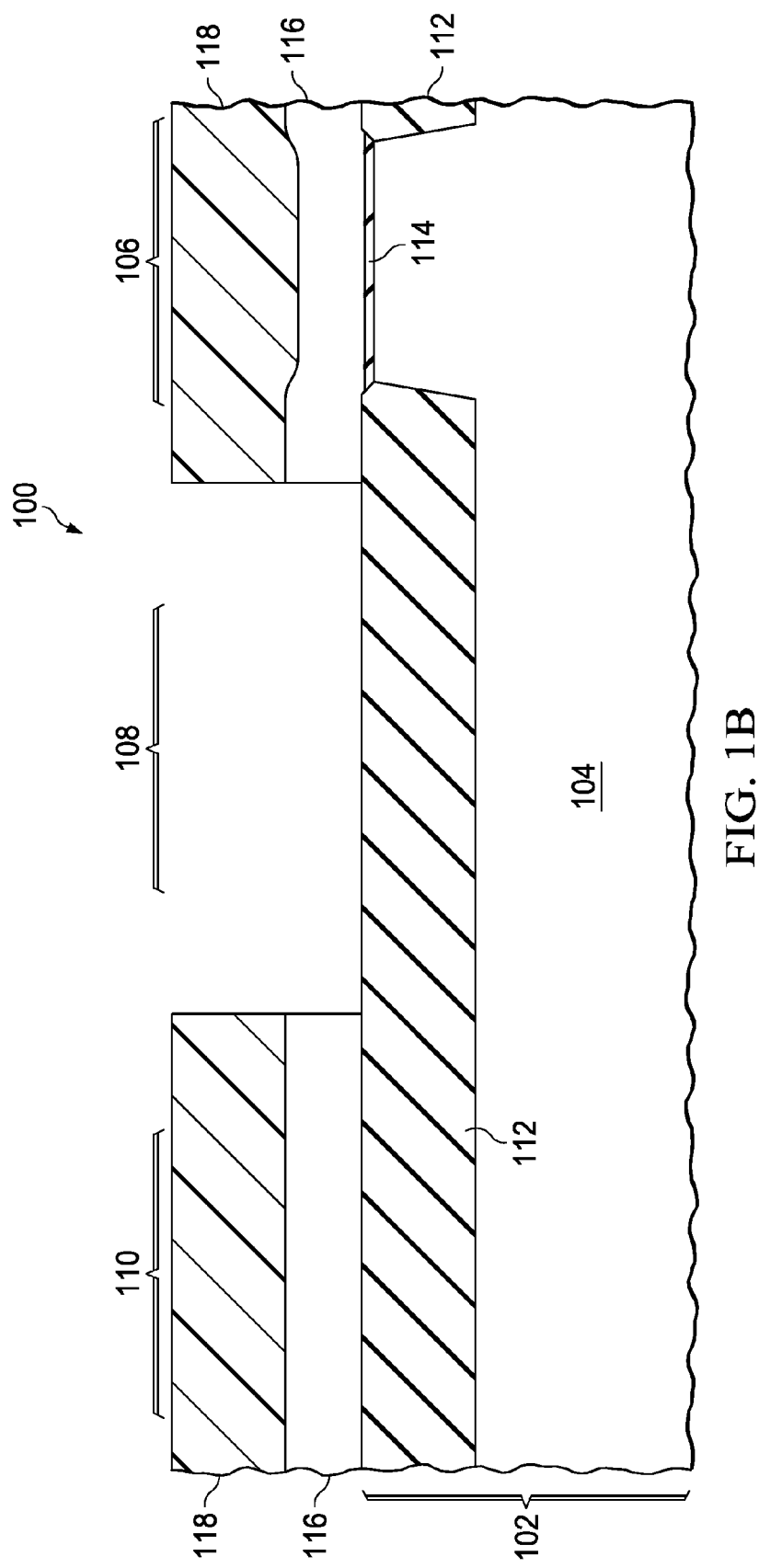
Figure 1C:
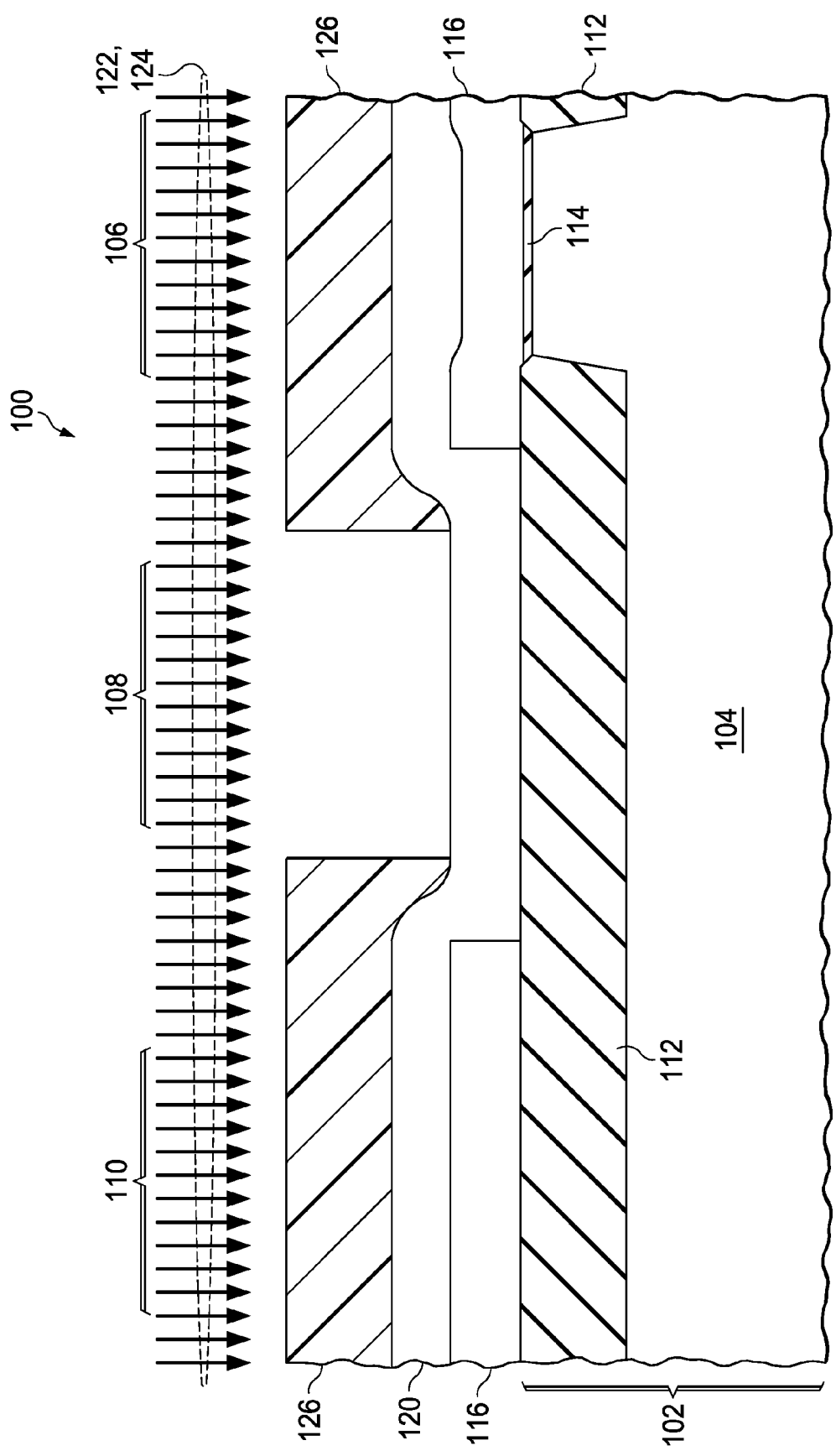
Figure 1D:
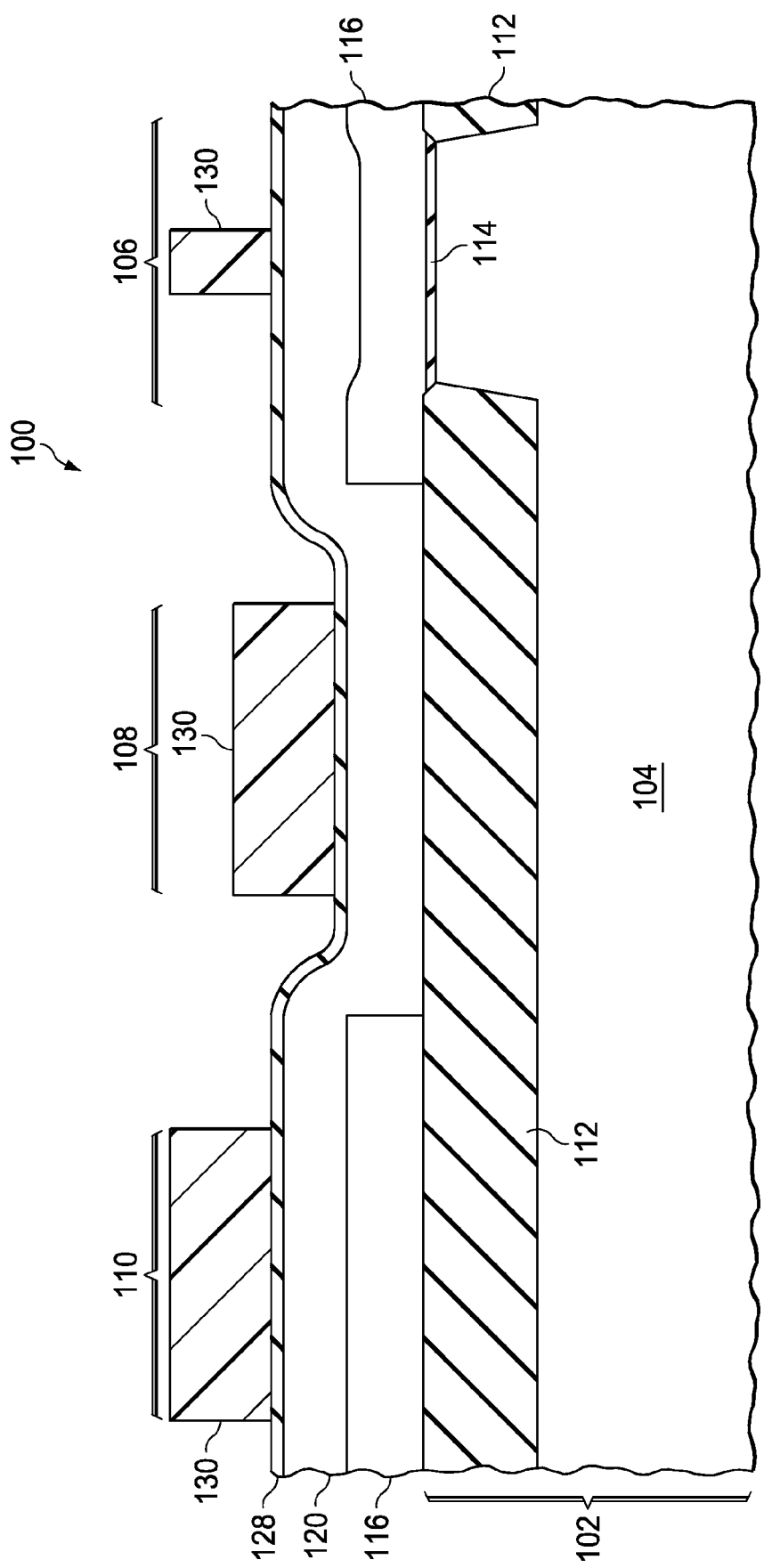
Figure 1E:
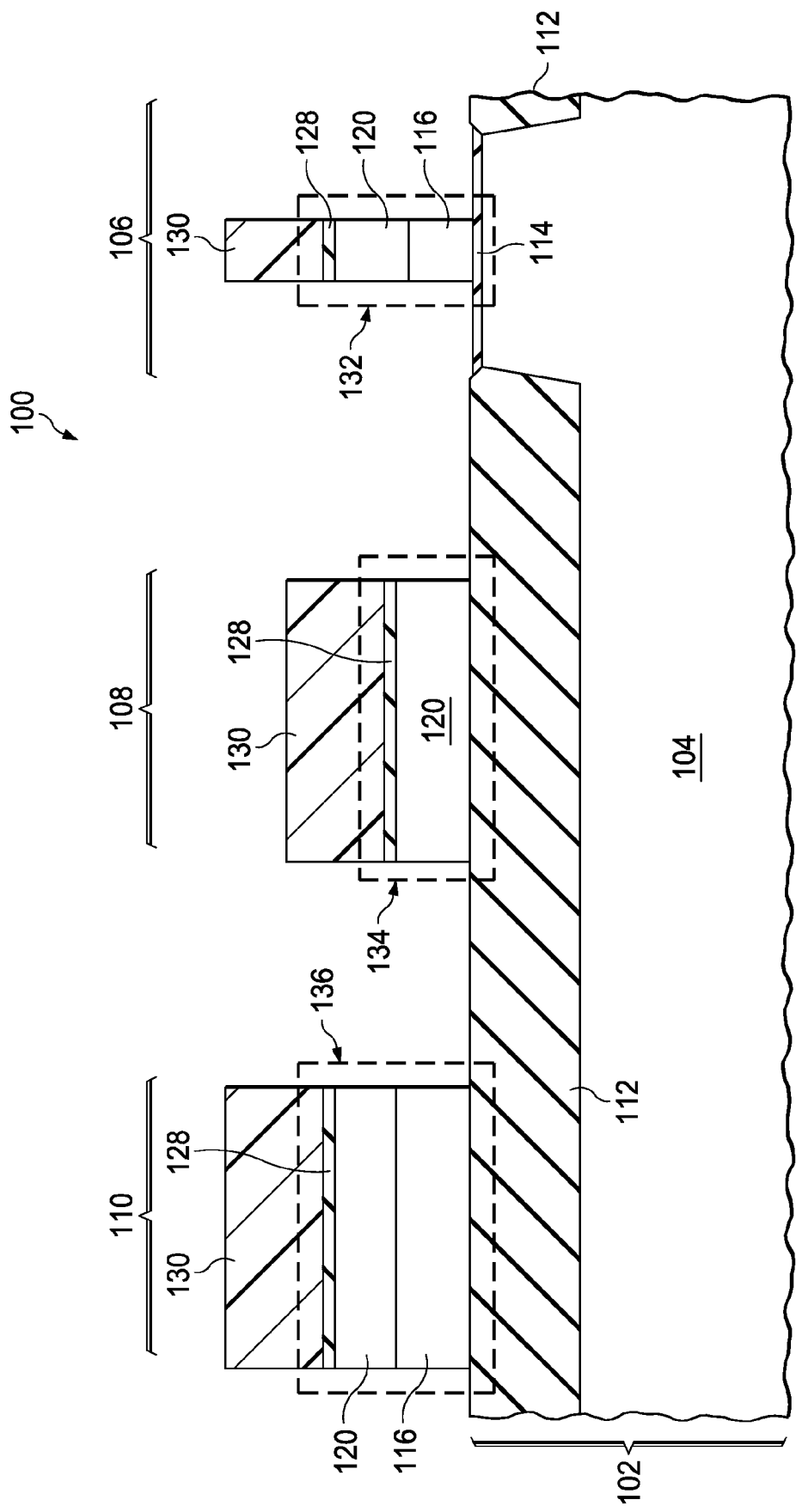
Figure 1F:
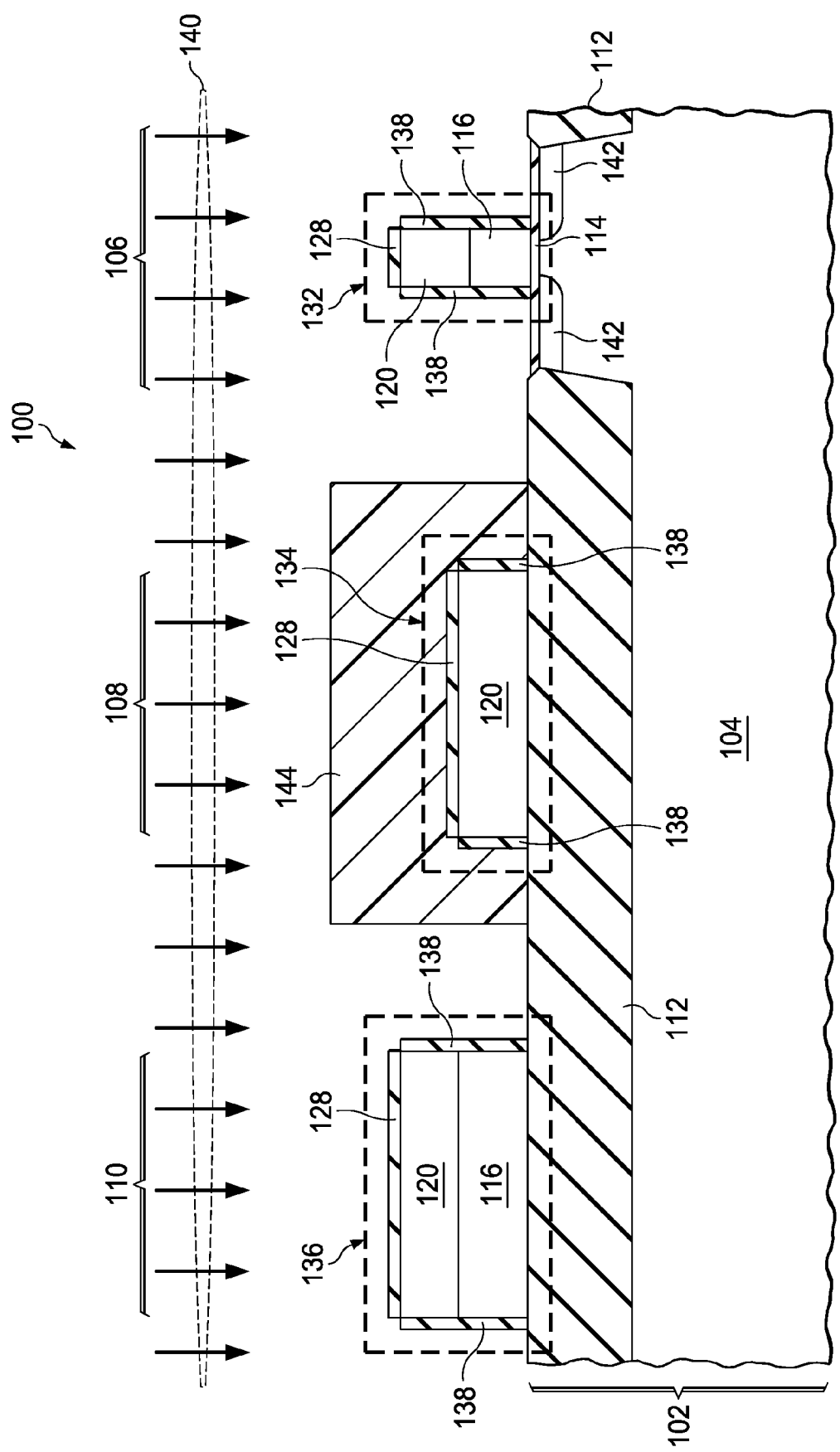
Figure 1G:
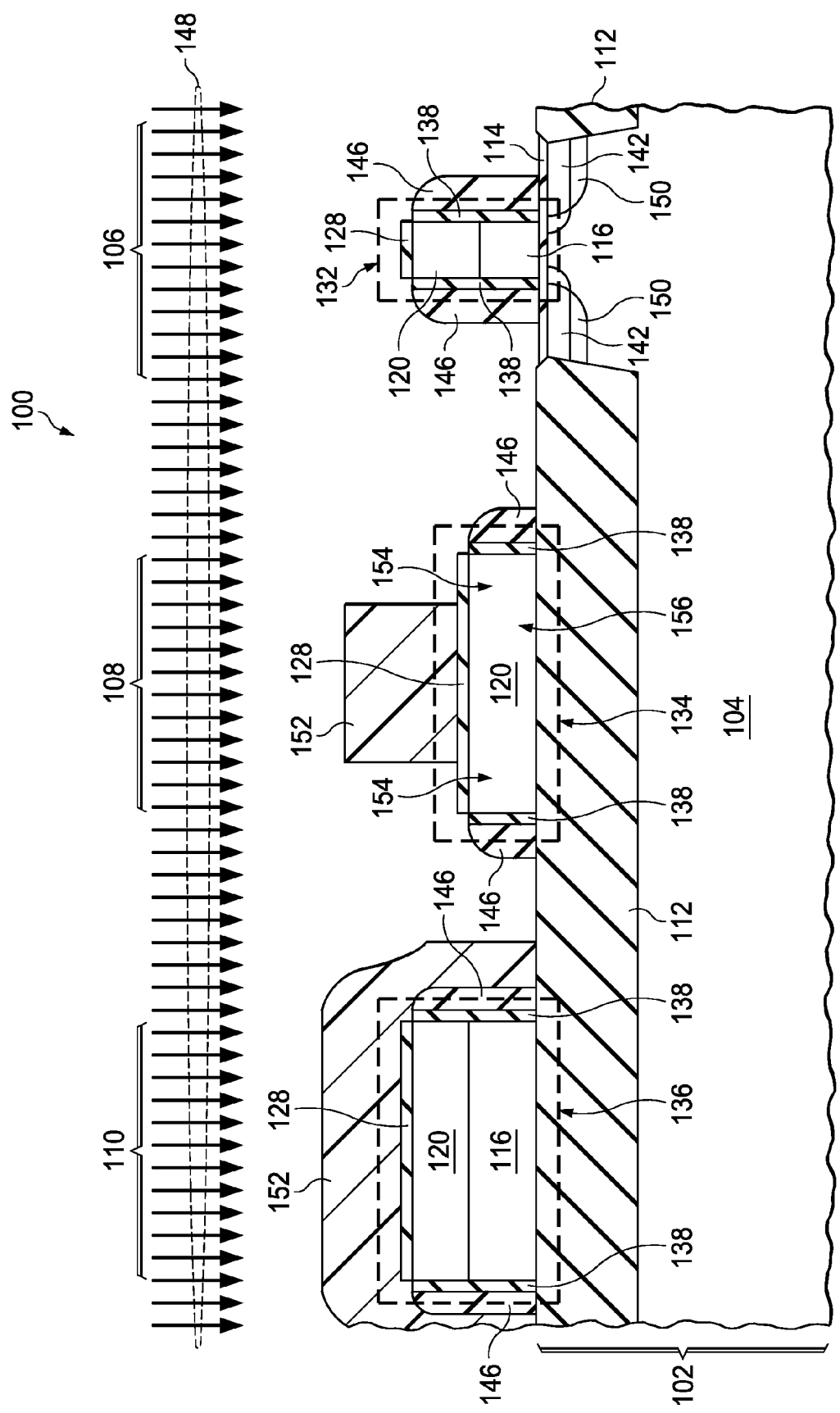
Figure 1H:
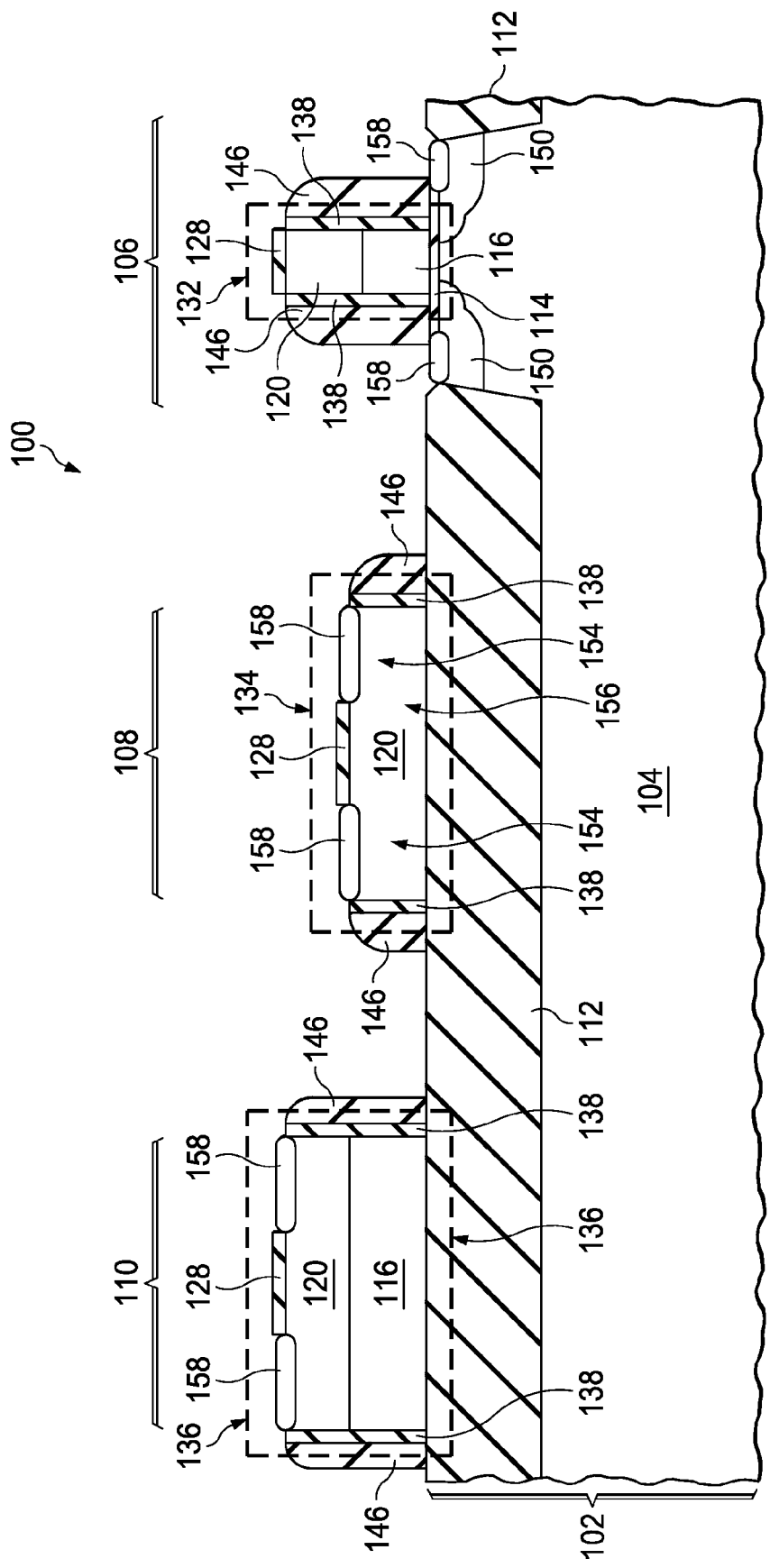
Figure 1I:
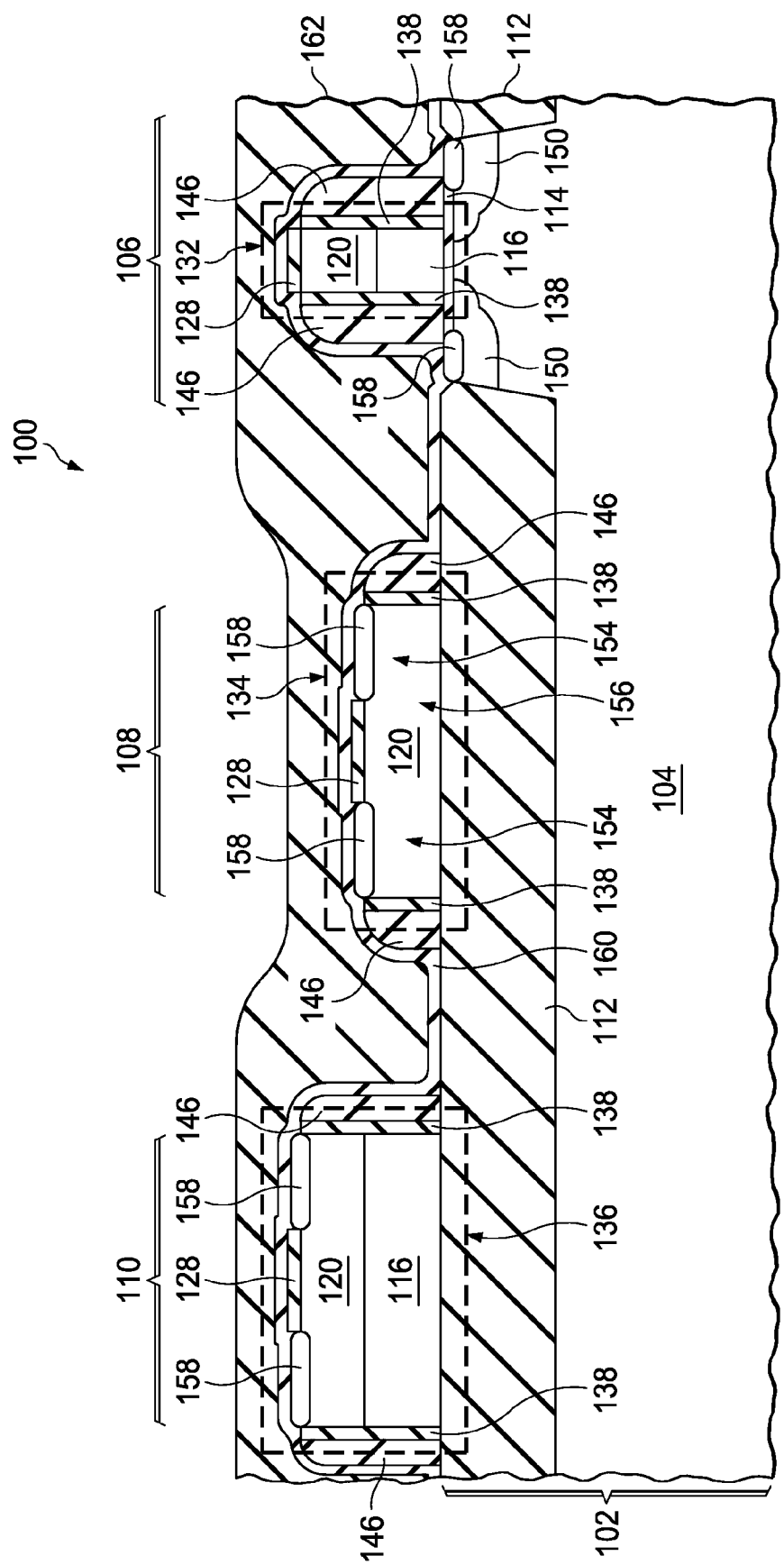
Figure 1J:
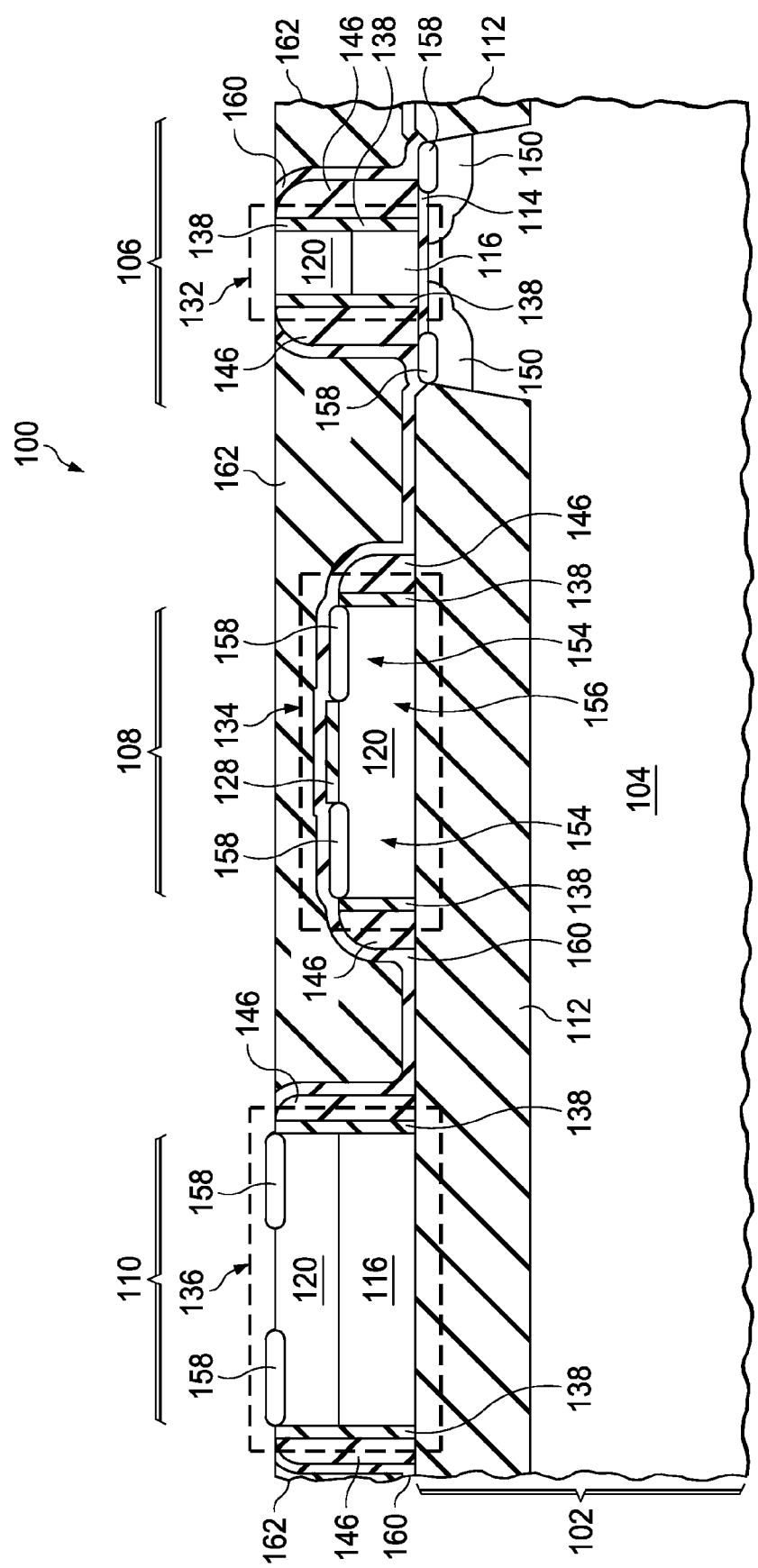
Figure 1K:
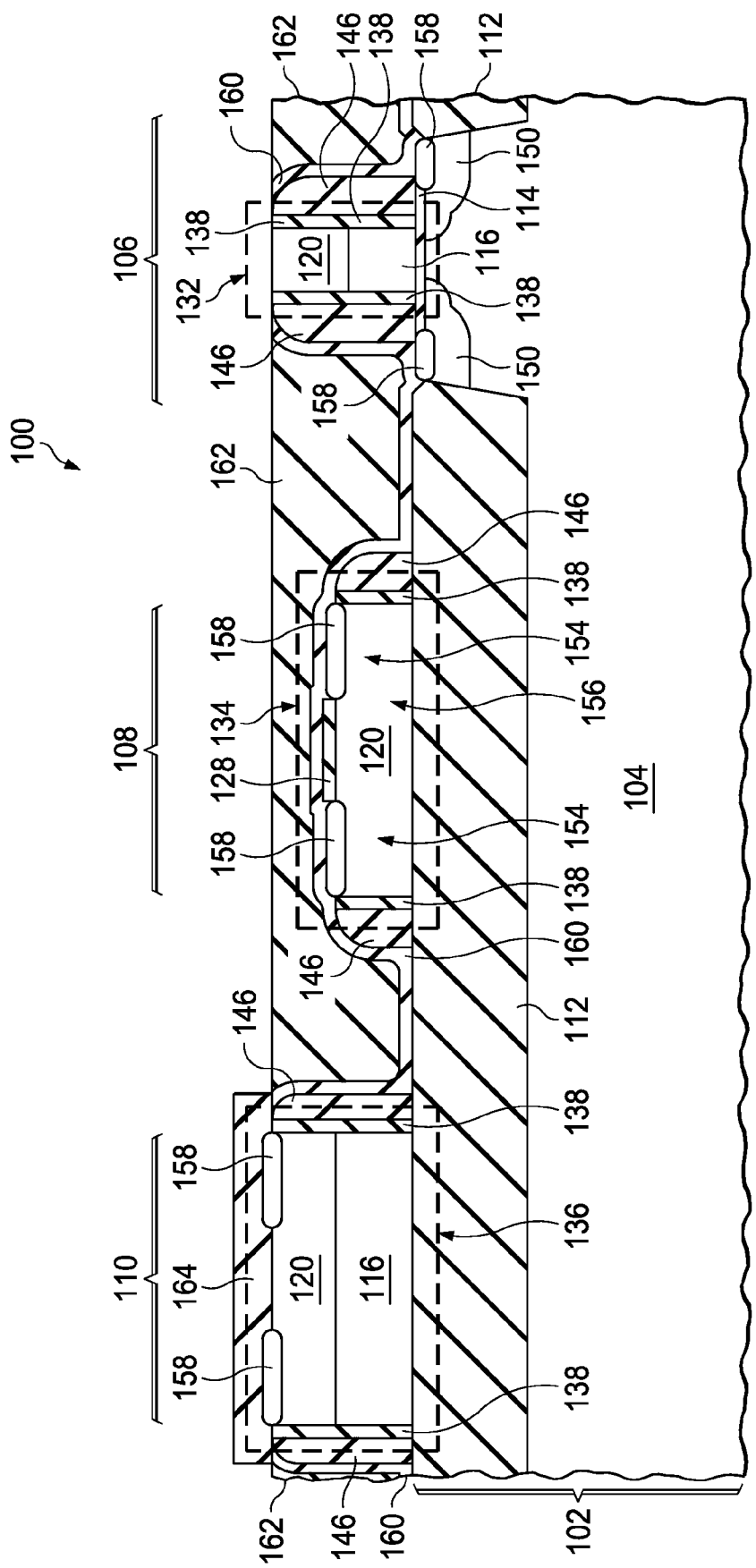
Figure 1L:
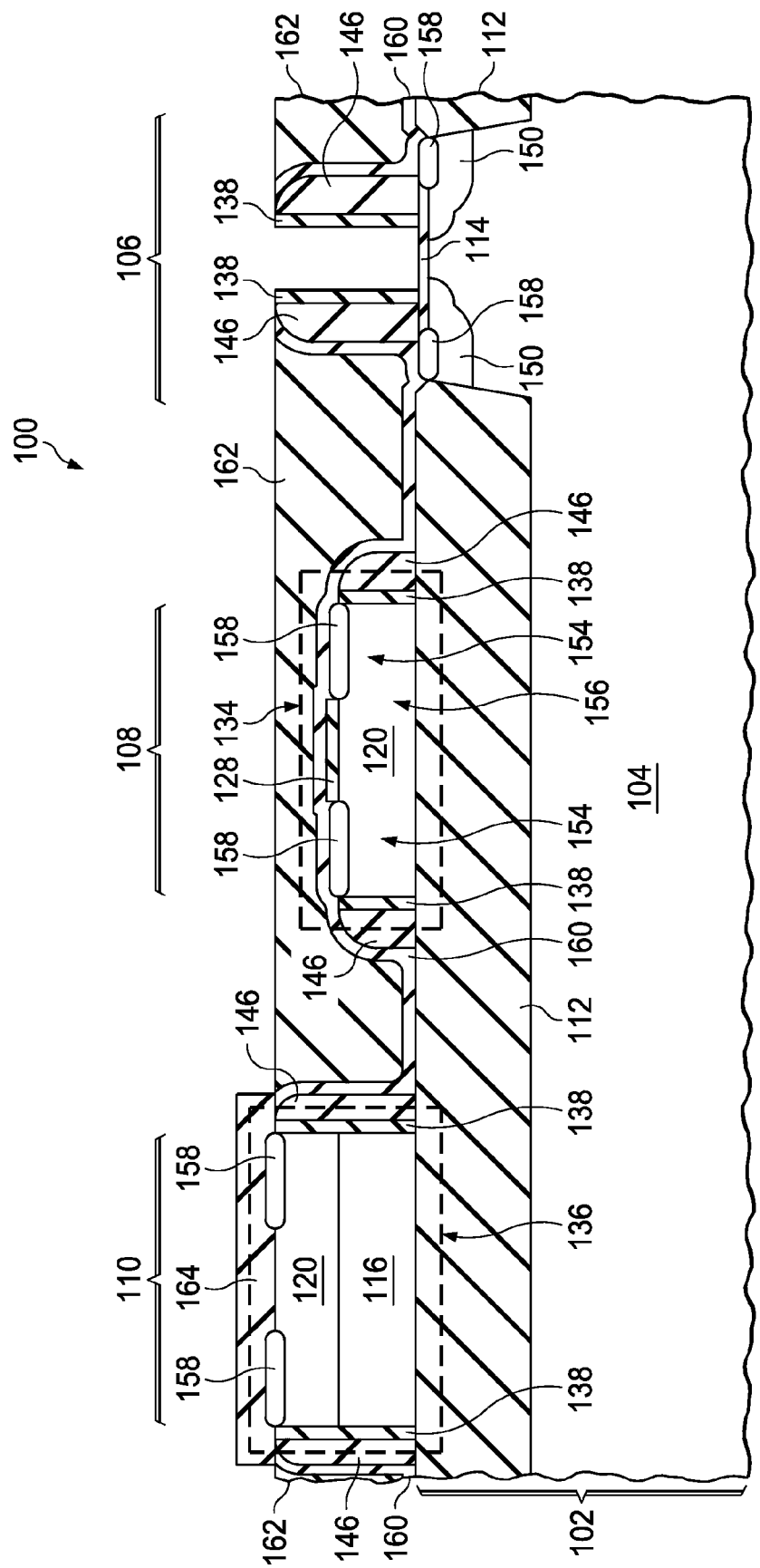
Figure 1M:
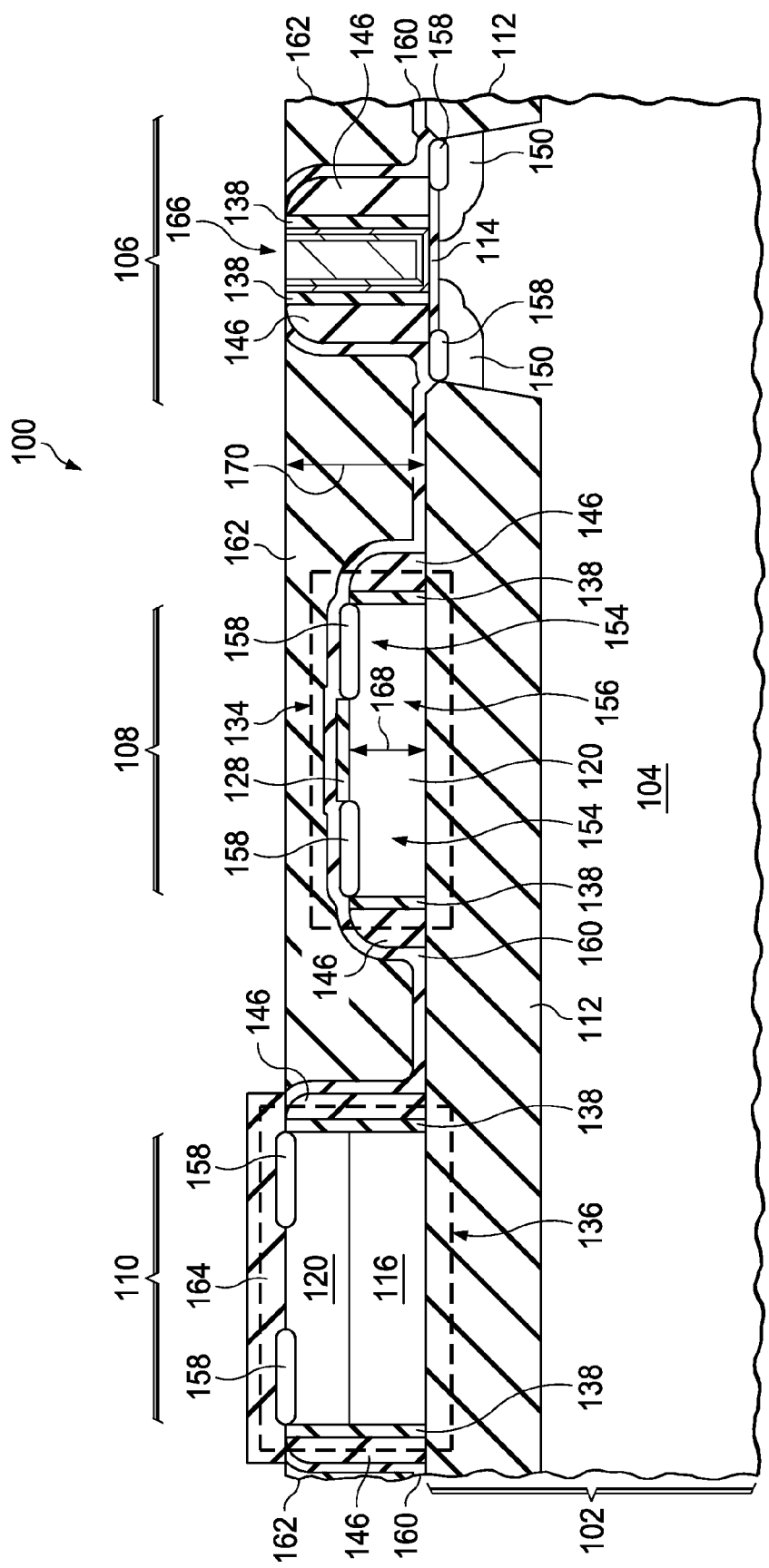
Figure 1N:
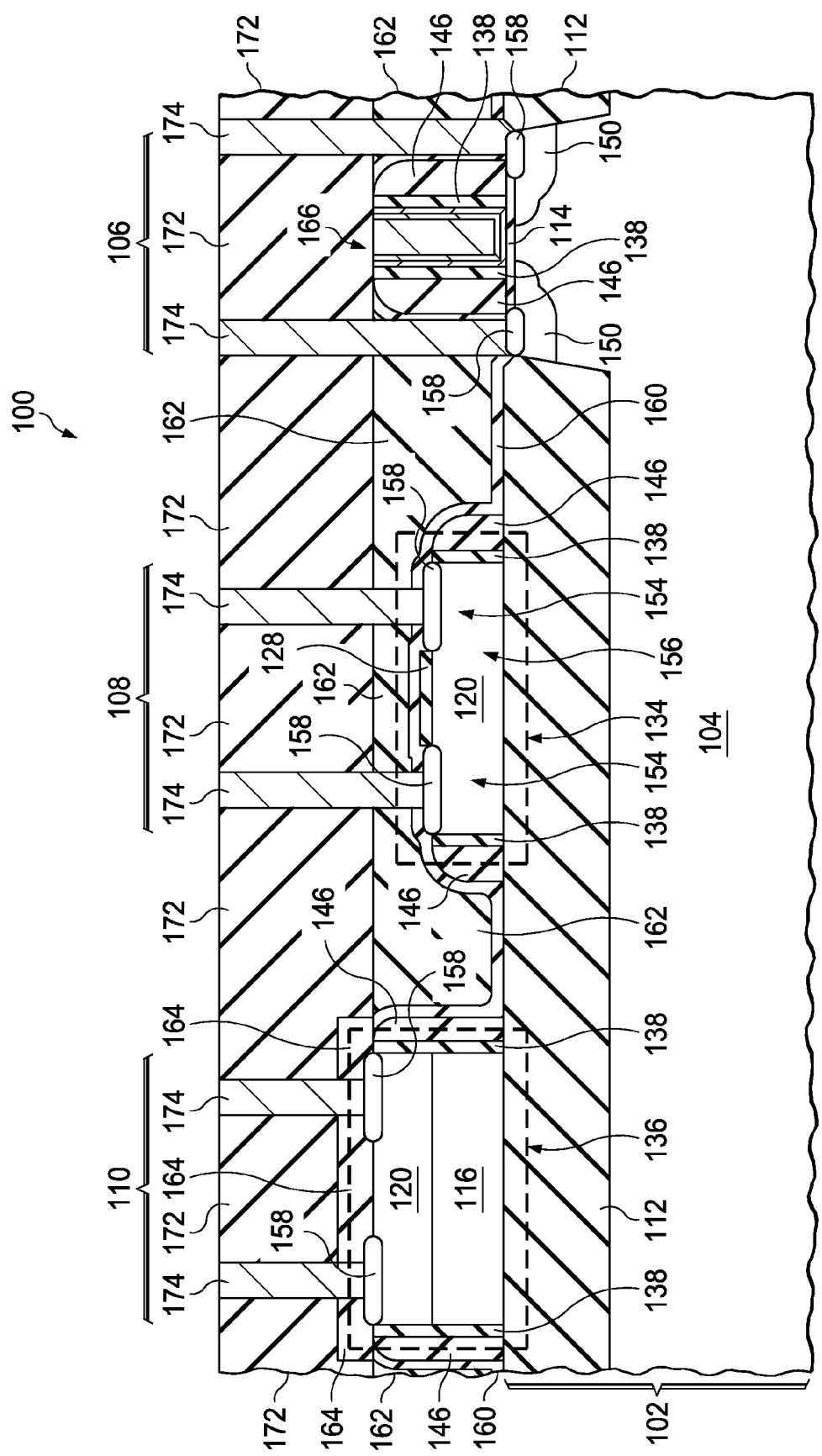

FIG. 1A through FIG. 1N are cross sections of an exemplary integrated circuit containing a thin polysilicon resistor and a metal gate transistor, depicted in successive stages of fabrication. Referring to FIG. 1A, the integrated circuit 100 is formed in and on a substrate 102 which includes semiconductor material 104. The integrated circuit 100 includes an area for the metal gate transistor 106 and an area for the thin polysilicon resistor 108, and possibly an area for an optional thick polysilicon resistor 110.

Field oxide 112 is formed at a top surface of the substrate 102 in the area for the thin polysilicon resistor 108 and the area for the optional thick polysilicon resistor 110. The field oxide 112 may include 250 nanometers to 500 nanometers of silicon dioxide and possibly sublayers of silicon nitride or other dielectric material. The field oxide 112 may be formed by a shallow trench isolation (STI) process or possibly by a local oxidation of silicon (LOCOS) process.

A gate dielectric layer 114 is formed at the top surface of the semiconductor material 104 in the area for the metal gate transistor 106. The gate dielectric layer 114 may include silicon dioxide formed by thermal oxidation of the semiconductor material, and may further include high-k dielectric materials such as hafnium oxide, zirconium oxide and/or tantalum oxide.

A first layer of polysilicon 116 is formed over an existing top surface of the integrated circuit 100. The first layer of polysilicon 116 has a thickness of, for example, 33 percent to 75 percent of a final gate thickness of the metal gate transistor 106, and so may be, per the example, 15 nanometers to 50 nanometers thick. The first layer of polysilicon 116 may possibly be undoped or lightly doped below $1 \times 10^{17}$ cm$^{-3}$, or alternatively may be doped above $1 \times 10^{17}$ cm$^{-3}$, for example by including dopant gases such as phosphine during formation of the first layer of polysilicon 116, or by subsequent ion implantation of dopants after the first layer of polysilicon 116 is formed. Ion implanted dopants may be implanted through an implant mask to restrict the dopants to desired areas for components such as resistors of a particular conductivity and transistors of a particular polarity.

A resistor opening mask 118 is formed over the first layer of polysilicon 116 which exposes the area for the thin polysilicon resistor 108, and covers the area for the metal gate transistor 106 and the area for the thick polysilicon resistor 110. The resistor opening mask 118 may include photoresist formed by a photolithographic process, or may include hard mask material such as silicon nitride or amorphous carbon, formed by a mask and etch process.

Referring to FIG. 1B, the first layer of polysilicon 116 is removed in areas exposed by the resistor opening mask 118, including the area for the thin polysilicon resistor 108, and is left in areas covered by the resistor opening mask 118, including the area for the metal gate transistor 106 and the area for the thick polysilicon resistor 110. The first layer of polysilicon 116 may be removed using a reactive ion etch (RIE) process which is selective to the field oxide 112. The resistor opening mask 118 is subsequently removed. Photoresist in the resistor opening mask 118 may be removed by ashing followed by a wet clean process using an aqueous mixture of sulfuric acid and hydrogen peroxide. Amorphous carbon in a hard mask layer of the resistor opening mask 118 may be removed by ashing. Silicon nitride in a hard mask layer of the resistor opening mask 118 may be removed using an RIE process that is selective to the first layer of polysilicon 116 and the field oxide 112.

Referring to FIG. 1C, a second layer of polysilicon 120 is formed over the first layer of polysilicon 116 and over the field oxide 112 in the area for the thin polysilicon resistor 108. The second layer of polysilicon 120 has a thickness of, for example, 50 percent to 75 percent of a final gate thickness of the metal gate transistor 106, and so may be, per the example, 25 nanometers to 50 nanometers thick. The second layer of polysilicon 120 may possibly be undoped or lightly doped below $1 \times 10^{17}$ cm$^{-3}$, so as to provide a desired high sheet resistivity in the thin polysilicon resistor 108. Alternatively, the second layer of polysilicon 120 may be doped p-type above $1 \times 10^{18}$ cm$^{-3}$, for example, to provide a desired low temperature coefficient of resistance in the thin polysilicon resistor 108, or may be doped n-type above $1 \times 10^{18}$ cm$^{-3}$, for example, to provide a desired low sheet resistance in the thin polysilicon resistor 108. The second layer of polysilicon 120 may be doped p-type by including p-type dopant gas such as diborane during formation of the second layer of polysilicon 120, or by subsequent ion implantation of p-type dopants 122 such as boron through an implant mask 126 which exposes the area for the thin polysilicon resistor 108. Analogously, the second layer of polysilicon 120 may be doped n-type by including n-type dopant gas such as phosphine during formation of the second layer of polysilicon 120, or by subsequent ion implantation of n-type dopants 124 such as phosphorus through the implant mask 126. The implant mask 126 is subsequently removed.

Referring to FIG. 1D, an optional cap layer 128 may be formed over the second layer of polysilicon 120. The cap layer 128 may be 2 nanometers to 5 nanometers of dielectric material such as silicon dioxide and/or silicon nitride. The cap layer 128 may advantageously prevent metal silicide from forming on a gate of the metal gate transistor 106 during a subsequent metal silicidation step. The cap layer 128 may also contribute to a hard mask functionality during a subsequent gate etch step.

A gate etch mask 130 is formed over the second layer of polysilicon 120, and over the cap layer 128 if present. The gate etch mask 130 may include several sublayers, for example a hard mask layer of silicon nitride on the cap layer 128, an amorphous carbon layer on the hard mask layer, an organic bottom anti-reflection coating (BARC) on the amorphous carbon layer, and a photoresist layer on the BARC. Other configurations of the gate etch mask 130 are within the scope of the instant example. The gate etch mask 130 covers the cap layer 128 if present or the second layer of polysilicon 120 if the cap layer 128 is not present in an area for the gate of the metal gate transistor 106, and the area for the thin polysilicon resistor 108 and the area for the thick polysilicon resistor 110, and exposes the cap layer 128 or the second layer of polysilicon 120 immediately outside these areas.

Referring to FIG. 1E, a gate etch process removes the cap layer 128, the second layer of polysilicon 120 and the first layer of polysilicon 116 in areas exposed by the gate etch mask 130 to form a sacrificial gate 132 of the metal gate transistor 106, a thin resistor body 134 of the thin polysilicon resistor 108, and a thick resistor body 136 of the thick polysilicon resistor 110. The gate etch process may include an RIE process which is selective to the field oxide 112 and the gate dielectric layer 114 using halogen radicals. The thin resistor body 134 of the thin polysilicon resistor 108 includes the second layer of polysilicon 120 and is free of the first layer of polysilicon 116. The thick resistor body 136 of the thick polysilicon resistor 110 includes the second layer of polysilicon 120 and the first layer of polysilicon 116.

A portion of the gate etch mask 130, for example the photoresist and the BARC, may be removed during the gate etch process. The remaining gate etch mask 130 is removed after the gate etch process is completed. The amorphous carbon may be removed by ashing. The hard mask layer may be removed by a plasma etch process that is selective to polysilicon.

Referring to FIG. 1F, offset spacers 138 may be formed on lateral surfaces of the sacrificial gate 132, the thin resistor body 134 and the thick resistor body 136. At least a portion of the offset spacers 138 may be formed, for example, by thermally oxidizing the lateral surfaces of the first layer of polysilicon 116 and the second layer of polysilicon 120. Another portion of the offset spacers 138 may be formed, for example, by forming a conformal layer of silicon dioxide, silicon nitride or other dielectric material over the sacrificial gate 132, the thin resistor body 134 and the thick resistor body 136, and subsequently using an anisotropic plasma etch process or an RIE process to remove the dielectric material from horizontal surfaces of the integrated circuit 100, leaving the offset spacers 138.

Dopants 140 are ion implanted into the semiconductor material 104 of the substrate 102 adjacent to the sacrificial gate 132 to form source/drain extensions 142 of the metal gate transistor 106. The source/drain extensions 142 are sometimes referred to as lightly doped drain (LDD) regions or medium doped drain (MDD) regions. An implant mask 144 of photoresist is formed to block the dopants 140 from areas of the integrated circuit 100 where not desired, for example from transistors of opposite polarity than the metal gate transistor 106.

The dopants 140 may possibly be implanted into the thick resistor body 136 and may be blocked from the thin resistor body 134 by the implant mask 144, as depicted in FIG. 1F. Alternatively, the dopants 140 may possibly be implanted into the thin resistor body 134 and/or may be blocked from the thick resistor body 136.

The implant mask 144 is removed after the dopants 140 are implanted. The implant mask 144 may be removed by ashing followed by a wet clean step using an aqueous mixture of sulfuric acid and hydrogen peroxide.

Referring to FIG. 1G, source/drain spacers 146 formed adjacent to lateral surfaces of the sacrificial gate 132, the thin resistor body 134 and the thick resistor body 136, on the offset spacers 138. The source/drain spacers 146 may be formed, for example, by forming conformal layers of silicon dioxide, silicon nitride and/or other dielectric material over the sacrificial gate 132, the thin resistor body 134 and the thick resistor body 136, and subsequently using an anisotropic plasma etch process or an RIE process to remove the dielectric material from horizontal surfaces of the integrated circuit 100, leaving the source/drain spacers 146.

Dopants 148 are ion implanted into the semiconductor material 104 of the substrate 102 adjacent to the sacrificial gate 132 to form source/drain regions 150 of the metal gate transistor 106. A source/drain mask 152 of photoresist is formed to block the dopants 148 from areas of the integrated circuit 100 where not desired, for example from transistors of opposite polarity than the metal gate transistor 106.

The dopants 148 may possibly be implanted into heads 154 of the thin resistor body 134 and may be blocked from a body section 156 of the thin resistor body 134 and from the thick resistor body 136 by the source/drain mask 152, as depicted in FIG. 1G. Alternatively, the dopants 140 may possibly be implanted into all of the thin resistor body 134 or may be blocked from the thin resistor body 134 by the source/drain mask 152, and similarly for the thick resistor body 136.

The source/drain mask 152 is removed after the dopants 148 are implanted. The source/drain mask 152 may be removed by ashing followed by a wet clean step using an aqueous mixture of sulfuric acid and hydrogen peroxide.

Referring to FIG. 1H, an anneal step is performed which activates the dopants in the source/drain extensions 142 of FIG. 1G and the source/drain regions 150 to form activated source/drain regions 150 of the metal gate transistor 106. Dopants implanted into the thin resistor body 134 and the thick resistor body 136 may concurrently be activated by the anneal step. The anneal step may include, for example, a laser anneal, a flash anneal and/or a spike anneal.

Metal silicide 158 may be formed at the top surface of the semiconductor material 104 in the source/drain regions 150, at a top surface of the second layer of polysilicon 120 in the heads 154 of the thin resistor body 134, and at a top surface of the second layer of polysilicon 120 in heads of the thick resistor body 136. The metal silicide 158 may be formed by depositing a layer of metal, such as nickel, nickel and platinum, cobalt or titanium, on a top surface of the integrated circuit 100, heating the layer of metal to react a portion of the metal with exposed silicon, and selectively removing unreacted metal from the integrated circuit 100 surface, commonly by exposing the unreacted metal to wet etchants including a mixture of an acid and hydrogen peroxide. The cap layer 128 on the sacrificial gate 132 prevents the metal silicide 158 from forming on the second layer of polysilicon 120 in the sacrificial gate 132. The cap layer 128 may be patterned on the thin resistor body 134 and the thick resistor body 136 to expose areas for the metal silicide 158, as depicted in FIG. 1H.

Referring to FIG. 1I, a PMD liner 160 may be formed over an existing top surface of the integrated circuit 100. The PMD liner 160 may include 5 nanometers to 20 nanometers of silicon nitride, possibly with a compressive stress greater than 100 megapascals. A PMD layer 162 is formed over the PMD liner 160 so as to cover the sacrificial gate 132 of the metal gate transistor 106, the thin resistor body 134 of the thin polysilicon resistor 108 and the thick resistor body 136 of the thick polysilicon resistor 110. The PMD layer 162 may include silicon dioxide formed by decomposition of tetraethyl orthosilicate, also known as tetraethoxysilane or TEOS, and ozone, sometimes referred to as a high aspect ratio process (HARP).

Referring to FIG. 1J, a top portion of the PMD layer 162 is removed, for example using a CMP process or a resist etchback process, so as to expose the sacrificial gate 132 and the thick resistor body 136. The PMD liner 160 and the cap layer 128 are removed over the sacrificial gate 132 and the thick resistor body 136. The thin resistor body 134 is not exposed and a portion of the PMD layer 162 remains over the thin resistor body 134. At least a portion of the metal silicide 158 on the thick resistor body 136 remains in place.

Referring to FIG. 1K, a blocking layer 164, for example of silicon dioxide or silicon nitride, is formed over the thick resistor body 136 to prevent removal of polysilicon during a subsequent gate removal process. The sacrificial gate 132 of the metal gate transistor 106 is not covered by the blocking layer 164.

Referring to FIG. 1L, the second layer of polysilicon 120 and the first layer of polysilicon 116 in the sacrificial gate 132 of FIG. 1K are removed. The removal process is performed without removing a significant portion of the PMD layer 162 or the blocking layer 164, so that the second layer of polysilicon 120 in the thin resistor body 134 and the second layer of polysilicon 120 and the first layer of polysilicon 116 in the thick resistor body 136 are not damaged. The second layer of polysilicon 120 and the first layer of polysilicon 116 in the sacrificial gate 132 may be removed, for example, using an aqueous solution of ammonium hydroxide or tetramethyl ammonium hydroxide (TMAH). The removal process may leave at least a portion of the gate dielectric layer 114 in place, as depicted in FIG. 1L, or alternatively may remove substantially all of the gate dielectric layer 114.

Referring to FIG. 1M, a metal replacement gate 166 is formed in the metal gate transistor 106. The metal replacement gate 166 may include, for example, one or more layers of titanium nitride, tantalum nitride, and/or aluminum. If the gate dielectric layer 114 was removed, a replacement gate dielectric layer, possibly including high-k materials such as hafnium oxide, zirconium oxide and/or tantalum oxide, may be formed in the metal gate transistor 106 prior to forming the metal replacement gate 166. A thickness 168 of the thin resistor body 134 may be, for example, 50 percent to 75 percent of a thickness 170 of the PMD layer 162 adjacent to the thin polysilicon resistor 108. The thin resistor body 134 is thinner than the metal replacement gate 166.

Referring to FIG. 1N, an interlevel dielectric (ILD) layer 172 is formed over an existing top surface of the integrated circuit 100. The ILD layer 172 may include boron-phosphorus-silicate glass (BPSG) or low-k dielectric material such as organo-silicate glass (OSG), and/or carbon-doped silicon oxides (SiCO or CDO). The ILD layer 172 may include a cap layer of silicon nitride-based material and/or silicon carbide-based material.

Contacts 174 are formed to make electrical connections to the metal gate transistor 106, the thin polysilicon resistor 108 and the thick polysilicon resistor 110. Instances of the contacts 174 are formed through the ILD layer 172, the PMD layer 162 and the PMD liner 160 to make electrical connections to the metal silicide 158 on the source/drain regions 150 of the metal gate transistor 106. Additional instances of the contacts 174 are formed through the ILD layer 172, the PMD layer 162 and the PMD liner 160 to make electrical connections to the metal silicide 158 on the heads 154 of the thin polysilicon resistor 108. Further instances of the contacts 174 are formed through the ILD layer 172 and the blocking layer 164 to make electrical connections to the metal silicide 158 on the heads 154 of the thick polysilicon resistor 110. The contacts 174 may be formed concurrently, or may be formed in separate groups. The contacts 174 may be formed in one piece, or may be formed in segments, for example with a lower segment through the PMD layer 162 and an upper segment through the ILD layer 172.

In the instant example, the PMD layer 162 covers the thin polysilicon resistor 108. A top surface of the second layer of polysilicon 120 in the thin polysilicon resistor 108 is below a top surface of the metal replacement gate 166 of the metal gate transistor 106 and below a top surface of the second layer of polysilicon 120 in the thick polysilicon resistor 110. Forming the thin polysilicon resistor 108 of the second layer of polysilicon 120 as described in the instant example advantageously reduces variation of a thickness of the thin resistor body 134 because the effective thickness of the thin resistor body 134 is primarily determined by a deposition thickness of the second layer of polysilicon 120. Variations due to deposition of the first layer of polysilicon 116 and the removal of the top portion of the PMD layer 162 do not substantially affect the thickness of the thin resistor body 134. Reducing the variation of the thickness of the thin resistor body 134 desirably reduces variation of an electrical resistance of the thin polysilicon resistor 108. The process flow described in reference to FIG. 1A through FIG. 1N is intended to illustrate how the thin polysilicon resistor 108 may be integrated into a replacement metal gate process flow. Details of how the thin polysilicon resistor 108 is integrated into various metal replacement gate process flows may change depending upon details of each process flow.

Figure 2A:
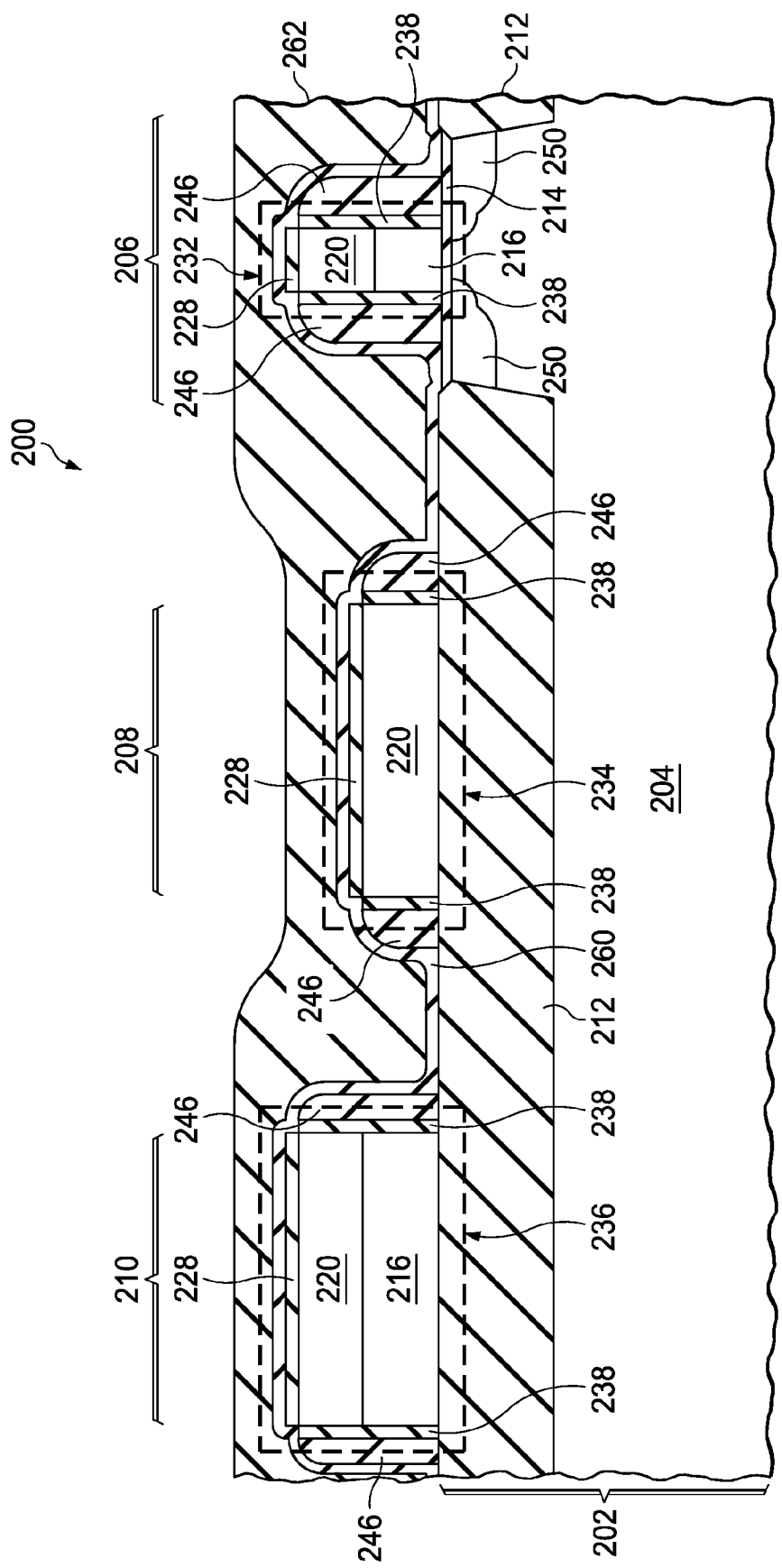

Formation of an alternative exemplary integrated circuit is illustrated in FIG. 2A through FIG. 2E. Instead of forming silicide after source and drain formation as in described in reference to FIG. 1H, silicide may be formed after etching contact holes. Referring to FIG. 2A, the integrated circuit 200 is formed in and on a substrate 202 which includes semiconductor material 204. The integrated circuit 200 includes an area for the metal gate transistor 206 and an area for the thin polysilicon resistor 208, and possibly an area for an optional thick polysilicon resistor 210. Field oxide 212 is formed at a top surface of the substrate 202 in the area for the thin polysilicon resistor 208 and the area for the optional thick polysilicon resistor 210.

The metal gate transistor 206 includes a gate dielectric layer 214 at the top surface of the substrate 202 and a sacrificial gate 232 over the gate dielectric layer 214; the sacrificial gate includes a first layer of polysilicon 216 over the gate dielectric layer 214, and a second layer of polysilicon 220 over the first layer of polysilicon 216, and possibly a cap layer 228 over the second layer of polysilicon 220. Activated source/drain regions 250 are formed in the semiconductor material 204 adjacent to the sacrificial gate 232.

The thin polysilicon resistor 208 includes a thin resistor body 234 which includes the second layer of polysilicon 220 and the cap layer 228 if present. The thin resistor body 234 is substantially free of the first layer of polysilicon 216, as described in reference to FIG. 1A through FIG. 1H. The thick polysilicon resistor 210 includes a thick resistor body 236 which includes the first layer of polysilicon 216, the second layer of polysilicon 220 and the cap layer 228.

Offset spacers 238 are formed on lateral surfaces of the sacrificial gate 232, the thin resistor body 234 and the thick resistor body 236. Source/drain spacers 246 formed adjacent to lateral surfaces of the sacrificial gate 232, the thin resistor body 234 and the thick resistor body 236, on the offset spacers 238. A PMD liner 260 may be formed over the metal gate transistor 206, the thin polysilicon resistor 208 the thick polysilicon resistor 210 as described in reference to FIG. 1I. A PMD layer 262 is formed over the PMD liner 260 so as to cover the metal gate transistor 206, the thin polysilicon resistor 208 and the thick polysilicon resistor 210.

Figure 2B:
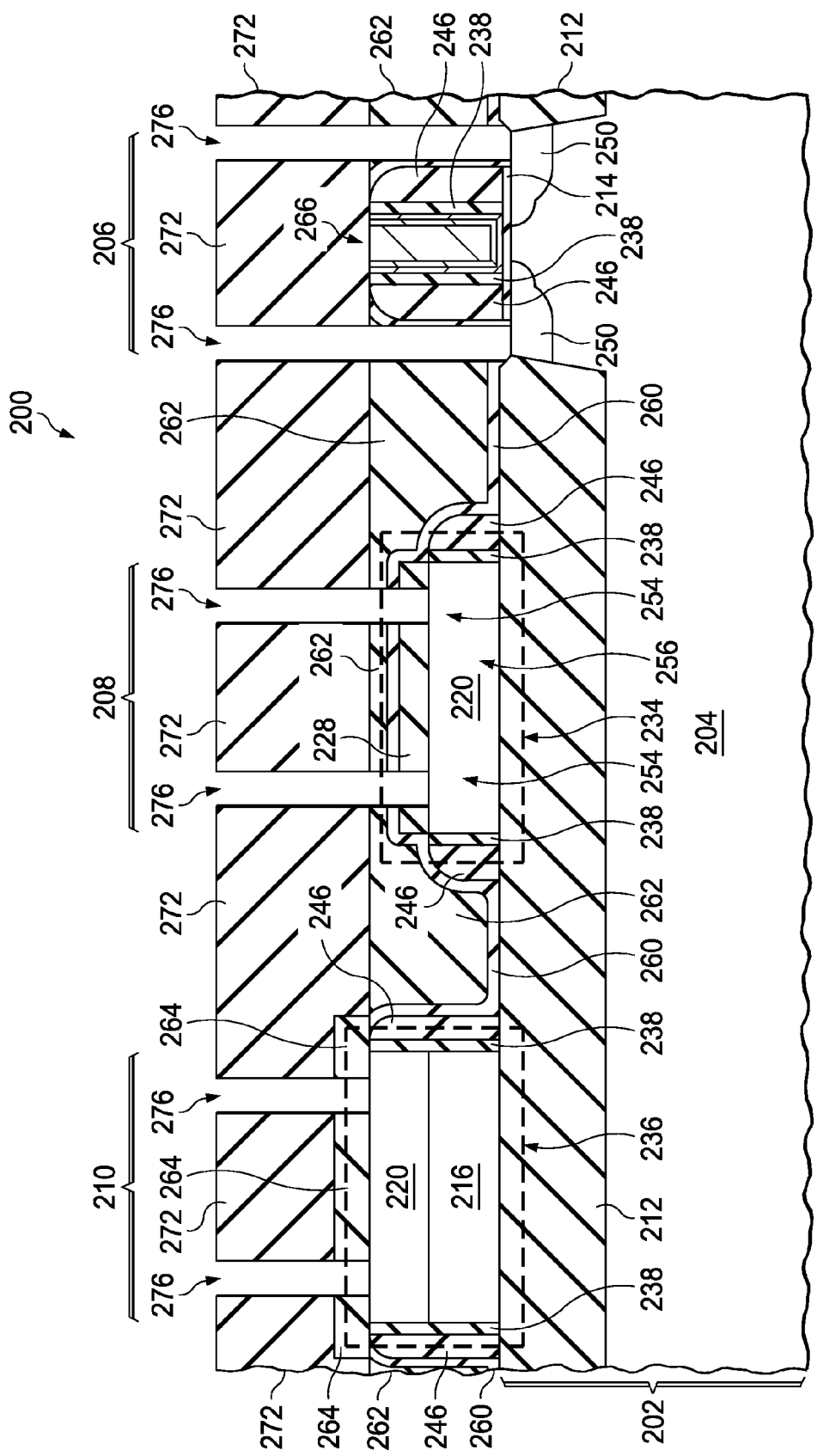

Referring to FIG. 2B, the PMD layer 262 is thinned as described in reference to FIG. 1J. A blocking layer 264 is formed over the thick resistor body 236 as described in reference to FIG. 1K. The second layer of polysilicon 220 and the first layer of polysilicon 216 in the sacrificial gate 232 of FIG. 2A are removed, as described in reference to FIG. 1L. A metal replacement gate 266 is formed in the metal gate transistor 206 as described in reference to FIG. 1M. An ILD layer 272 is formed over an existing top surface of the integrated circuit 200 as described in reference to FIG. 2N.

Contact holes 276 are formed through the ILD layer 272, the PMD layer 262, the PMD liner 260, the blocking layer 264 and the cap layer 228 so as to expose the source/drain regions 250 of the metal gate transistor 206, heads 254 of the thin resistor body 234, and the thick resistor body 236. The contact holes 276 may be formed using an RIE process which is selective to polysilicon and the source/drain regions 250.

Figure 2C:
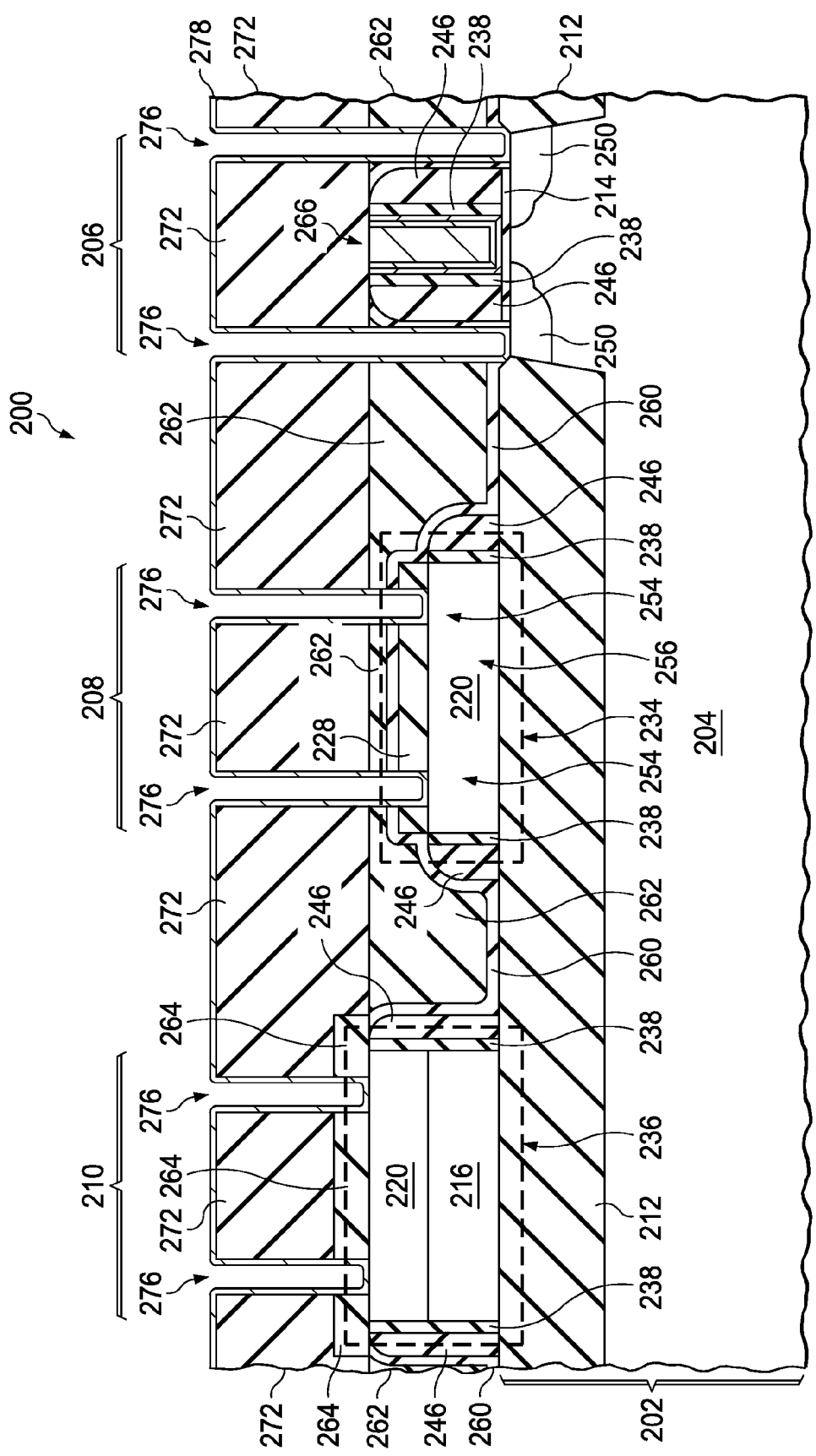

Referring to FIG. 2C, a layer of refractory metal 278 is formed over the ILD layer 272, extending into the contact holes 276 and making contact with the source/drain regions 250 of the metal gate transistor 206, heads 254 of the thin resistor body 234, and the thick resistor body 236. The layer of refractory metal 278 may include, for example, 5 nanometers to 15 nanometers of nickel with 10 to 15 percent platinum and 5 nanometers to 20 nanometers of titanium nitride formed by atomic layer deposition (ALD) over the nickel platinum.

Figure 2D:
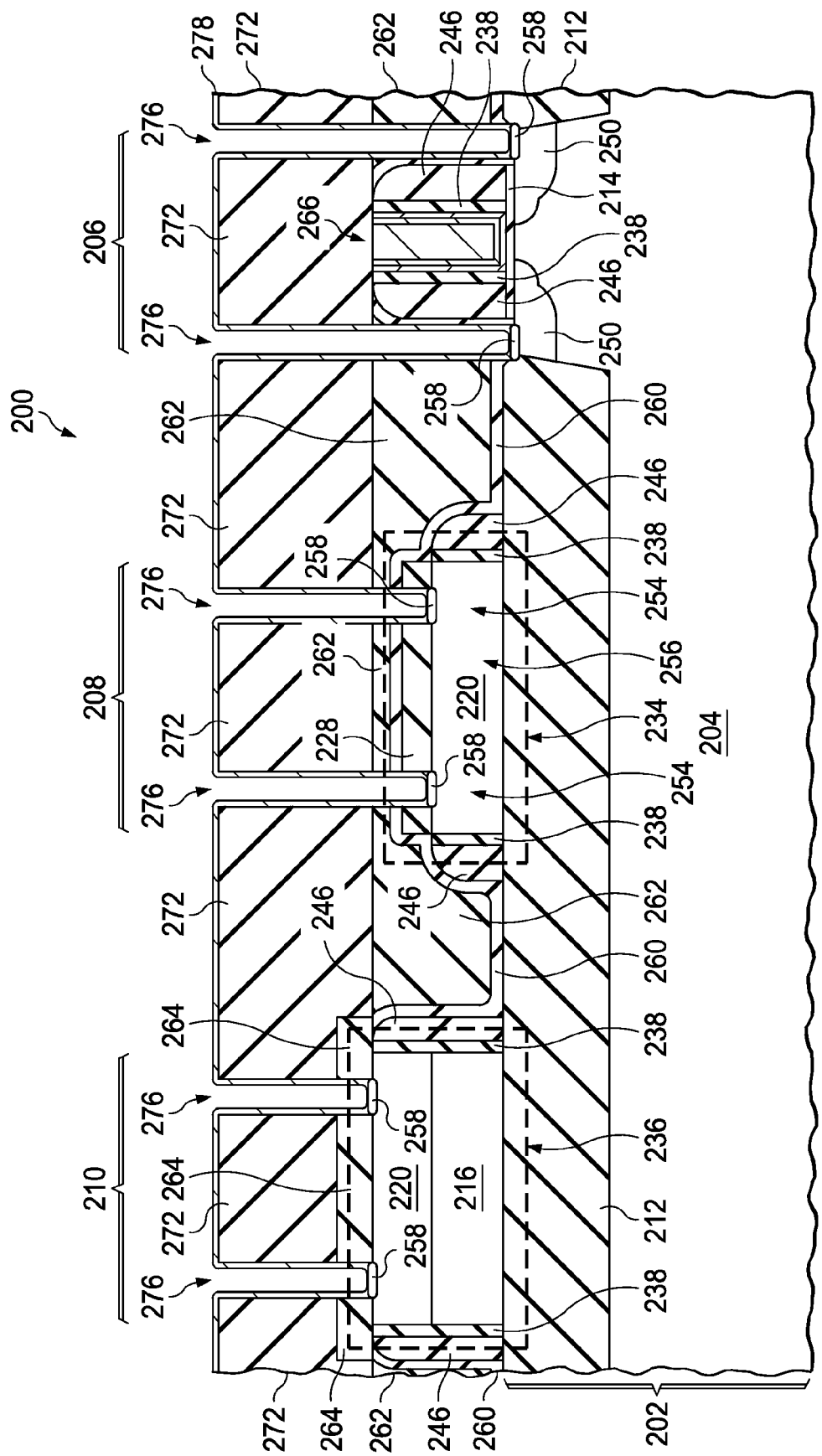

Referring to FIG. 2D, the layer of refractory metal 278 is heated to react refractory metal with silicon to form metal silicide 258 at areas of contact between the layer of refractory metal 278 and the source/drain regions 250 of the metal gate transistor 206, heads 254 of the thin resistor body 234, and the thick resistor body 236. The temperature and time required for formation of the metal silicide 258 will depend on details of a pre-deposition cleanup in the contact holes, composition and thickness of the layer of refractory metal 278, and widths of the contact holes 276, among other parameters. An exemplary silicide formation process may include heating the layer of refractory metal 278 described above to 300° C. for 30 seconds.

Following formation of the metal silicide 258, remaining refractory metal in the layer of refractory metal 278 is removed. The remaining refractory metal may be removed, for example, using a wet etch of an aqueous mixture of sulfuric acid and hydrogen peroxide.

Figure 2E:
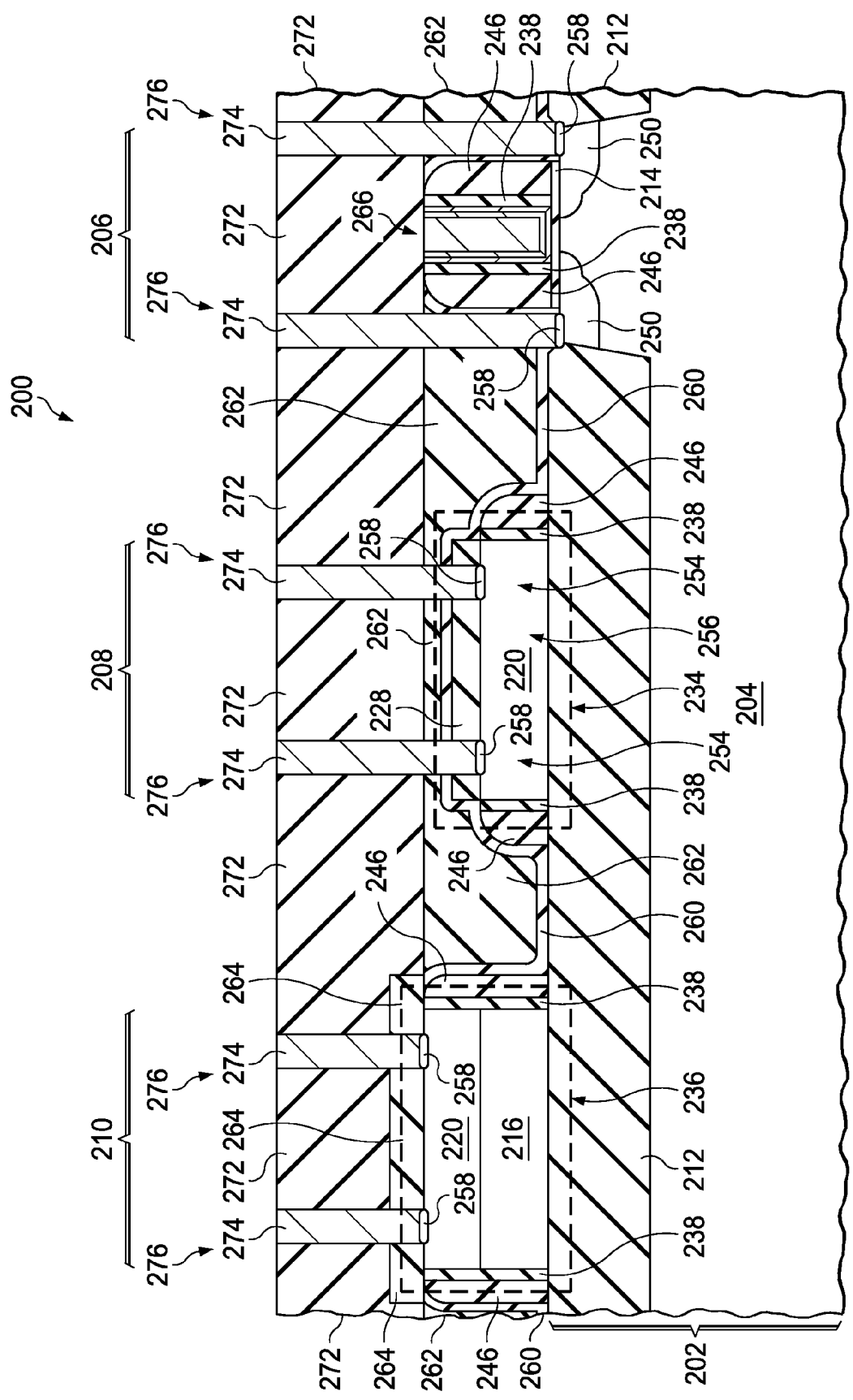

Referring to FIG. 2E, contacts 274 are formed in the contact holes 276 on the metal silicide 258. Forming the metal silicide 258 after forming the contact holes 276 may advantageously simplify a fabrication sequence and reduce fabrication cost for the integrated circuit 200 by eliminating the need to preserve the metal silicide during processing of the PMD layer 262.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
    a metal gate transistor having a metal gate;
    a pre-metal dielectric (PMD) layer over a substrate of said integrated circuit, such that said PMD layer does not extend over said metal gate;
    a thin polysilicon resistor disposed above said substrate, said thin polysilicon resistor being thinner said metal gate, such that said PMD layer extends over said thin polysilicon resistor; and
    a thick polysilicon resistor disposed over said substrate, said thick polysilicon resistor being thicker than said thin polysilicon resistor, said thick polysilicon resistor including a first layer of polysilicon and a second layer of polysilicon over said first layer of polysilicon, such that said PMD layer does not extend over said thick polysilicon resistor, said thin polysilicon resistor including said second layer of polysilicon and being free of said first layer of polysilicon.

2. The integrated circuit of claim 1, in which said layer of polysilicon of said thin polysilicon resistor is doped below $1 \times 10^{17}$ cm-3.

3. The integrated circuit of claim 1, in which said layer of polysilicon of said thin polysilicon resistor is doped p-type above $1 \times 10^{18}$ cm-3.

4. The integrated circuit of claim 1, in which said layer of polysilicon of said thin polysilicon resistor is doped n-type above $1 \times 10^{18}$ cm-3.

5. The integrated circuit of claim 1, in which said layer of polysilicon of said thin polysilicon resistor is disposed over field oxide.

6. The integrated circuit of claim 1, in which said layer of polysilicon of said thin polysilicon resistor has metal silicide at heads of said thin polysilicon resistor.

7. The integrated circuit of claim 1, in which a thickness of a layer of polysilicon of said thin polysilicon resistor is 50 percent to 75 percent of a thickness of said PMD layer adjacent to said thin polysilicon resistor.

\* \* \* \* \*